United States Patent
Rinck et al.

(10) Patent No.: US 9,230,852 B2
(45) Date of Patent: Jan. 5, 2016

(54) INTEGRATED CIRCUIT (IC) HAVING ELECTRICALLY CONDUCTIVE CORROSION PROTECTING CAP OVER BOND PADS

(71) Applicants: Texas Instruments Incorporated, Dallas, TX (US); TEXAS INSTRUMENTS DEUTSCHLAND GmbH, Freising (DE)

(72) Inventors: Helmut Rinck, Moosburg (DE); Fromund Metz, Marzling (DE); Jan Hermann Pape, Freising (DE); Janet Riley, Hideaway, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/775,484

(22) Filed: Feb. 25, 2013

(65) Prior Publication Data

US 2014/0239500 A1    Aug. 28, 2014

(51) Int. Cl.
*H01L 23/48* (2006.01)
*H01L 21/768* (2006.01)
*H01L 23/00* (2006.01)
*H01L 23/34* (2006.01)
*H01L 23/552* (2006.01)
*H01L 23/31* (2006.01)
*H01L 23/367* (2006.01)

(52) U.S. Cl.
CPC .............. *H01L 21/768* (2013.01); *H01L 23/34* (2013.01); *H01L 23/552* (2013.01); *H01L 24/05* (2013.01); *H01L 23/3171* (2013.01); *H01L 23/367* (2013.01); *H01L 23/3677* (2013.01); *H01L 2224/05554* (2013.01); *H01L 2924/1461* (2013.01)

(58) Field of Classification Search
CPC .............................. H01L 33/00; H01L 21/768
USPC ......................................................... 257/751
See application file for complete search history.

(56) References Cited

U.S. PATENT DOCUMENTS

| | | | |
|---|---|---|---|
| 6,091,082 A | 7/2000 | Thomas et al. | |
| 2001/0051426 A1* | 12/2001 | Pozder et al. | 438/666 |
| 2003/0227041 A1* | 12/2003 | Atwood et al. | 257/296 |
| 2003/0230803 A1* | 12/2003 | Matsuo | 257/734 |
| 2008/0093712 A1 | 4/2008 | Zenz | |
| 2010/0117195 A1* | 5/2010 | Burke et al. | 257/532 |
| 2011/0193220 A1* | 8/2011 | Kuo et al. | 257/737 |

* cited by examiner

*Primary Examiner* — Ajay K Arora
(74) *Attorney, Agent, or Firm* — Jacqueline J. Garner; Frank D. Cimino

(57) ABSTRACT

An integrated circuit (IC) die has a top side surface providing circuitry including active circuitry configured to provide a function, including at least one bond pad formed from a bond pad metal coupled to a node in the circuitry. A dielectric passivation layer is over a top side surface of a substrate providing a contact area which exposes the bond pad. A metal capping layer includes an electrically conductive metal or an electrically conductive metal compound over at least the contact area to provide corrosion protection to the bond pad metal, which is in electrical contact with the bond pad metal. The metal capping layer can extend over structures other than the bond pads, such as to cover at least 80% of the area of the IC die to provide structures on the IC die protection from incident radiation.

17 Claims, 2 Drawing Sheets

INTEGRATED CIRCUIT (IC) HAVING ELECTRICALLY CONDUCTIVE CORROSION PROTECTING CAP OVER BOND PADS

FIELD

Disclosed embodiments relate to integrated circuits (ICs) having bond pads including corrosion protection.

BACKGROUND

The electronics industry is tasked with providing reliable circuitry, such as to satisfy the need for uninterrupted reliability for as long as 10 years or more. Corrosion-induced service failures are one source of reliability failures. For example, corrosion of printed circuit boards (PCBs) and IC die can have the effect of causing electrical opens, as well as electrical shorts when the corrosion products creep among the electrical conductors. This shorting mode, sometimes referred to as creep corrosion, is exacerbated when sensitive electronic products (having exposed corrodible metal) are deployed in regions of the world that have significant levels of air pollutants which may be corrosive to metals (e.g., $Cl_2$, $H_2S$, $NH_3$, $SO_2$, and $NO_2$).

Bond pad and interconnect line corrosion can be mitigated in several ways. The electrically conductive materials used can be selected more wisely, such as based on available corrosion data. The electrically conductive materials can be protected from the pollutants by the use of protective coatings, device enclosures, or in some limited applications by the relocation of equipment to more protected environments. Humidity is a chief contributor to corrosion, as water allows intimate access of concentrated contaminating species (some of which become strong acids in the presence of water) and transportation of corrosion products. A passivation layer comprising silicon nitride or silicon oxynitride may provide better environmental performance as compared to conventional silicon oxide passivation, but the passivation layer needs to be exposed over the bond pad areas to allow electrical contact thereto, typically by a bondwire, which renders the exposed bond pad areas susceptible to corrosion.

SUMMARY

Disclosed embodiments include integrated circuit (IC) die having a metal capping layer that is positioned on at least a contact area of the bond pad area of the IC die. Bond pad metals such as Al—Cu which are susceptible to atmospheric-induced corrosion are protected by a disclosed metal capping layer which provides a corrosion resistant metal material on the otherwise exposed bond pad metal in the contact area. The metal capping layer can also be used to cover other areas of the IC die for providing light protection to the circuitry to avoid device failure or shifts due to p-n junction currents resulting from light exposure. Disclosed ICs can also be utilized without any packaging material (e.g., a plastic package) while still providing corrosion protection to the bond pads in corrosive environments, as well as providing light shielding in high brightness environments. Disclosed metal capping layers when provided over most of the total IC die area can also provide an effective Faraday shield to provide electromagnetic and radiation shielding for the IC die.

BRIEF DESCRIPTION OF THE DRAWINGS

Reference will now be made to the accompanying drawings, which are not necessarily drawn to scale, wherein.

DETAILED DESCRIPTION

Figure 1A:
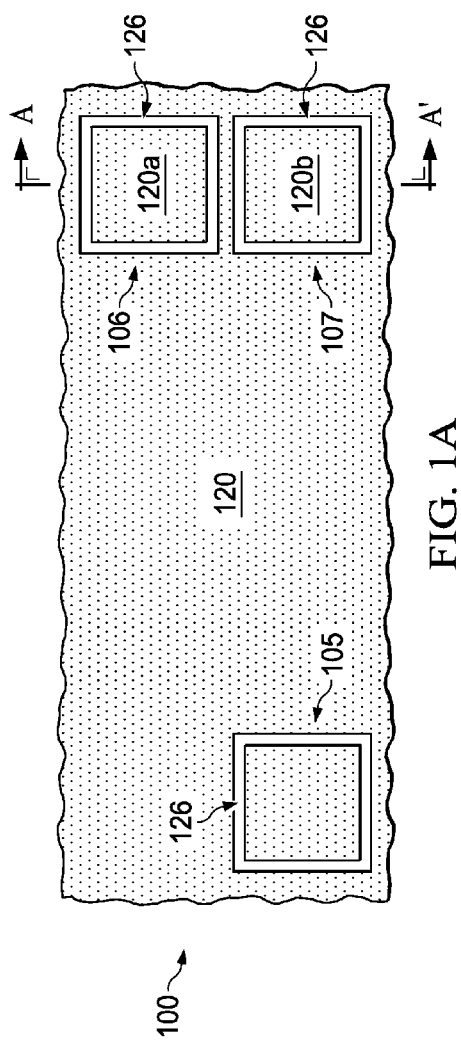
FIG. 1A is a top view depiction of an example IC die having a disclosed metal capping layer at least on the contact area of the bond pad metal, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a top view depiction of an example IC die 100 having a disclosed metal capping layer 120 at least on the contact area of the bond pad metal of example bond pads 105, 106 and 107, according to an example embodiment. Three (3) example bond pads 105-107 are shown including a disclosed metal capping layer 120 thereon, with each bond pad 105-107 electrically isolated by isolation regions 126 (which have no metal capping layer 120) from other areas on the metal capping layer 120 on the IC die 100. The number of bond pads, position of bond pads, and shape of the bond pads shown in FIG. 1A are all arbitrary.

The metal capping layer comprises an electrically conductive metal or an electrically conductive metal compound which is in electrical contact with the bond pad metal 121 of the bond pads 105-107. The metal capping layer 120 can be about 0.2 µm to 10 µm thick. In one embodiment, the metal capping layer 120 can comprise aluminum or an aluminum alloy, such as Al or AlSi. The metal capping layer 120 can also comprise a noble metal. The noble metals are known in the material arts to be metals that are resistant to corrosion and oxidation in moist air, unlike most base metals such as copper which are readily corrodible. The bondable noble metals as used herein include (in order of increasing atomic number) ruthenium, rhodium, palladium, osmium, iridium, platinum, and gold (Au). Au has the advantage of a relatively simple method of deposition.

The metal capping layer 120 can be seen to cover at least eighty (80) % of the area of the IC die 100, and can cover the entire die area except for the isolation regions 126 which electrically isolate the portions of the metal capping layer 120 (shown as 120a and 120b in FIG. 1B) of the bond pad metal 121 of the bond pads 105-107 from other portions of the metal capping layer 120. A cut line A-A' is shown in FIG. 1A which is the basis for the cross sectional depiction of the IC die 100 shown in FIG. 1B.

Figure 1B:
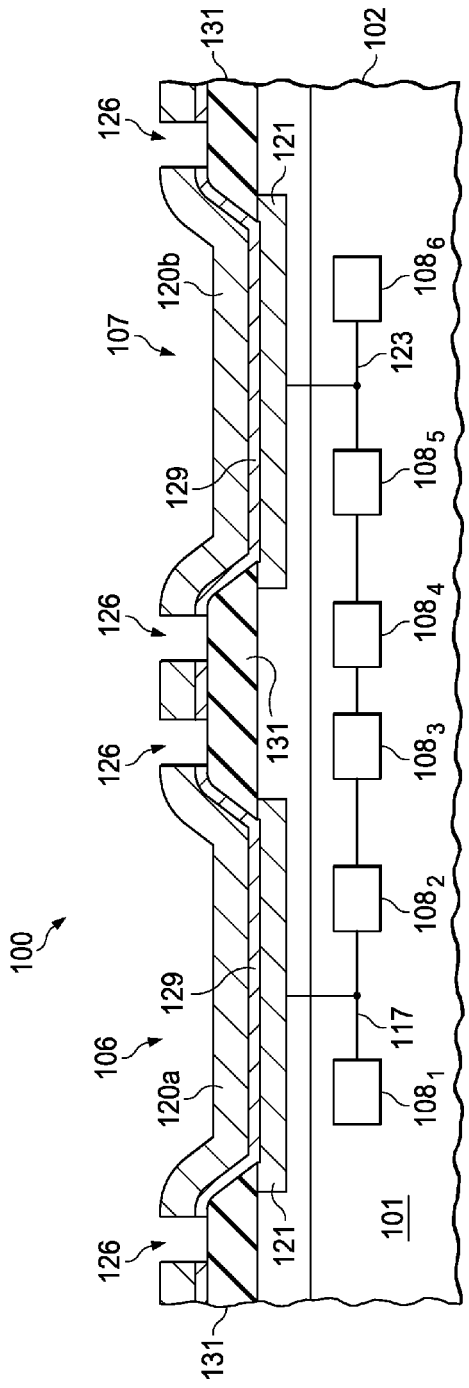
FIG. 1B is a cross sectional depiction of the IC die shown in FIG. 1A.

FIG. 1B is a cross sectional depiction of the example IC die 100 shown in FIG. 1A having a disclosed metal capping layer 120 shown including portions 120a and 120b on the bond pad metal 121 of the bond pads 106, 107. IC die 100 includes a substrate 101 having a top side surface 102 providing circuitry shown as blocks $108_1$-$108_6$ which include active circuitry configured together to provide at least one circuit function. Circuitry $108_1$-$108_6$ can include a memory including a plurality of bits, such as in the case of an IC including a static random access memory (SRAM). Memory cells are known to be light sensitive and can flip bits as a result of light exposure, which can be blocked by the metal capping layer 120 over the memory cells.

Substrate 101 can comprise a variety of substrate materials, such as silicon, so that the top side surface 102 can comprise single crystal silicon in one particular embodiment. However, substrate 101 and top side surface 102 can each comprise a variety of other materials, such as SiGe, or a Ga—N compound semiconductor. In one embodiment the top side substrate surface 102 may comprise an epitaxial layer on a single-crystal substrate 101. Both n-type and p-type may be used for substrate 101 and top side surface 102.

Bond pad 106 is shown coupled to node 117 and bond pad 107 is shown coupled to node 123. Some bond pads may not be coupled to nodes on the IC die 100, and instead be coupled to the bottom side of the IC die, such as by through-silicon vias (TSVs) on the die to provide a ground or power supply contact on the top side of the IC die 100. A dielectric passivation layer 131 over the top side surface 102 which is patterned to provide a contact area which exposes the top surface of bond pads 106 and 107.

As described above, the metal capping layer 120 comprises an electrically conductive metal or an electrically conductive metal compound which is in electrical contact with the bond pad metal 121 of the bond pads 106 and 107. IC die 100 is shown including a refractory metal barrier layer 129 between the metal capping layer 120a and 120b and the bond pad metal 121 over the contact area of the bond pads. The refractory metal barrier layer 129 in one embodiment comprises TiW. Other known materials for the refractory metal barrier layer 129 include TiN, Ta, TaN, Ta—Si—N and WNx. A typical thickness for the refractory metal barrier layer 129 is from 0.1 µm to 0.5 µm.

Figure 2:
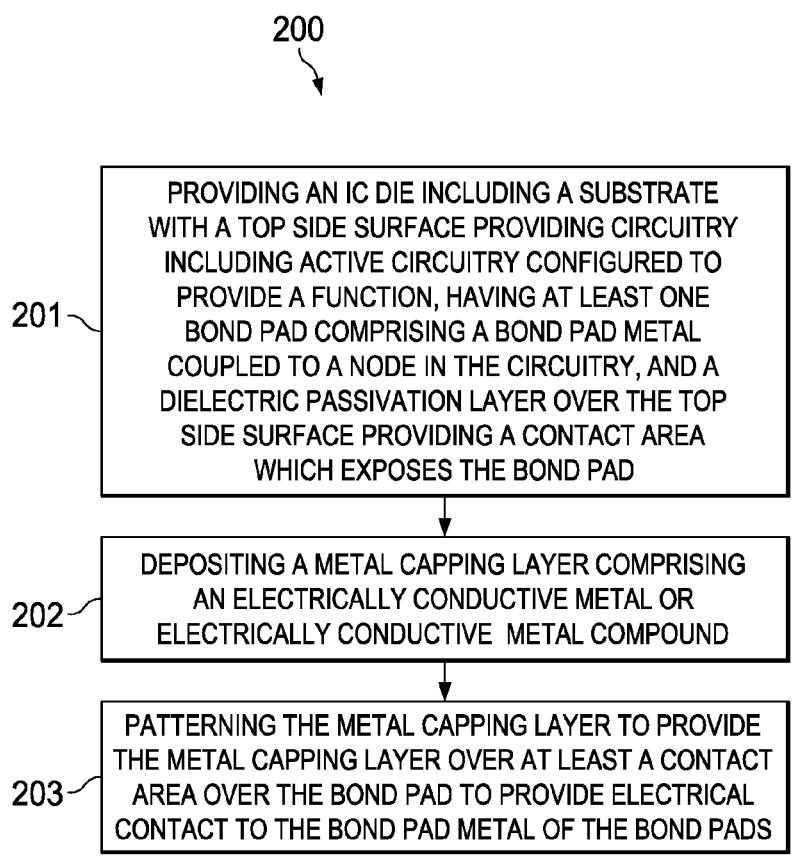
FIG. 2 is a flow chart that shows steps in an example method for forming IC die having a disclosed metal capping layer at least on the contact area of the bond pad metal, according to an example embodiment.

FIG. 2 is a flow chart that shows steps in an example method 200 for forming IC die having a disclosed metal capping layer at least on the contact area of the bond pad metal, according to an example embodiment. Step 201 comprise providing an IC die including a substrate having top side surface providing circuitry including active circuitry configured to provide a function, having at least one bond pad comprising a bond pad metal coupled to a node in the circuitry, and a dielectric passivation layer over the top side surface providing a contact area which exposes the bond pad. Step 202 depositing a metal capping layer on a dielectric passivation layer on the IC die comprising an electrically conductive metal or electrically conductive metal compound. In one embodiment, the depositing of the metal capping layer can comprise a sputter process and the metal capping layer can comprise Al or AlSi. In one another embodiment, the depositing of the metal capping layer can also comprise an electroplating process and the metal capping layer can comprise gold.

Step 203 comprises patterning the metal capping layer to provide the metal capping layer over at least a contact area over the bond pads having an exposed bond pad metal. When the metal capping layer comprises Al, a positive mask may be used. When the metal capping layer comprises gold, and inverse mask may be used. The resulting metal capping layer is in electrical contact with the bond pad metal over the contract area. The metal capping layer after patterning can cover at least eighty (80) % of an area of the IC die, such as at least 95% of an area of the IC die.

The method can further comprise depositing a refractory metal barrier layer before depositing the metal capping layer.

Advantages of disclosed embodiments include savings of packaging materials as the metal capping layer when provided over most of the total IC die area can protect the IC die from incident light and from corrosion eliminating the need for a conventional package for the IC die. Joule heating for some IC die during operation can be high. For such IC die, heat transfer is aided from the top side of the IC die since the metal capping layer provides good thermal conductivity, and when provided over most of the total IC die area can provide a heat spreader which improves heat transfer to the ambient. Disclosed metal capping layers when provided over most of the total IC die area can also provide an effective Faraday shield to provide electromagnetic and radiation shielding for the IC die.

EXAMPLES

Disclosed embodiments are further illustrated by the following specific Examples, which should not be construed as limiting the scope or content of this Disclosure in any way.

A wafer is provided including a plurality of IC die having a top side surface providing circuitry including active circuitry configured to provide a function, following fabrication, includes metallization and a passivation overcoat (PO) thereon. The metallization may be single level, or multi-level. The top metal layer is a patterned layer and provides bond pads which at least some of which are coupled to nodes in the IC. In this example the top metal layer is AlCu, which is known to be prone to corrosion.

A refractive metal barrier layer is deposited, for example, 0.2 µm of TiW may be deposited. A metal capping layer comprising an electrically conductive metal or an electrically conductive metal compound is deposited and then patterned. For example, the metal capping layer can be about 0.5 µm to 4 µm thick, and can comprise Au, Al or AlSi. Following patterning of the metal capping layer, the metal capping layer at least covers the contact area of the bond pad and is thus in electrical contact with the bond pad metal via the refractive metal barrier layer. The exposed TiW is then removed, such as by a plasma process to remove any surface TiW oxides, followed by a TiW wet etch to clear the exposed TiW. A sinter at about 435° C. (e.g., in $N_2$, or $N_2/H_2$ (forming gas) can be used to reduce fixed charge density. The wafer can then be singulated into a plurality of die. The die may be directly mounted to a substrate (e.g., printed circuit board), and bonded to using the metal capping layer capped bond pads, such as by bond wires.

Disclosed embodiments can be used to form semiconductor die that may integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. An integrated circuit (IC) die, comprising:
a substrate having a top side surface providing circuitry including active circuitry configured to provide a function, having at least one bond pad comprising a bond pad metal coupled to a node in said circuitry, and a dielectric passivation layer over said top side surface providing a contact area which exposes said bond pad, and a metal capping layer and having a first portion over at least said contact area in electrical contact with said bond pad metal and a second portion over the dielectric passivation layer not in electrical contact with any bond pad metal.

2. The IC die of claim 1, wherein said metal capping layer covers at least eighty (80)% of an area of said IC die.

3. The IC die of claim 1, wherein said metal capping layer comprises aluminum.

4. The IC die of claim 1, wherein said metal capping layer comprises a noble metal.

5. The IC die of claim 4, wherein said noble metal comprises gold.

6. The IC die of claim 1, further comprising a refractory metal barrier layer between said metal capping layer and said bond pad metal over said contact area.

7. The IC die of claim 1, wherein said top side surface comprises single crystal silicon.

8. The IC die of claim 1, wherein said IC die comprises a memory including a plurality of bits.

9. The IC die of claim 1, wherein said bond pad metal comprises copper.

10. A method of fabrication integrated circuit (IC) die, comprising:

providing an IC die including a substrate with a top side surface providing circuitry including active circuitry configured to provide a function, having at least one bond pad comprising a bond pad metal coupled to a node in said circuitry, and a dielectric passivation layer over said top side surface providing a contact area which exposes said bond pad, depositing a metal capping layer on said dielectric passivation layer, and patterning said metal capping layer to provide said metal capping layer over at least said contact area, wherein a first portion of said metal capping layer is in electrical contact with said bond pad metal over said contact area and a second portion of the metal capping layer is not in electrical contact with any bond pad metal.

11. The method of claim 10, wherein said metal capping layer is 0.2 µm to 10 µm thick.

12. The method of claim 10, further comprising depositing a refractory metal barrier layer before depositing said metal capping layer.

13. The method of claim 10, wherein said metal capping layer covers at least eighty (80)% of an area of said IC die.

14. The method of claim 10, wherein said depositing said metal capping layer comprises a sputter process and said metal capping layer comprises aluminum.

15. The method of claim 10, wherein said depositing said metal capping layer comprises an electroplating process and said metal capping layer comprises gold.

16. The method of claim 10, wherein said top side surface comprises single crystal silicon.

17. The method of claim 10, wherein said bond pad metal comprises copper.

* * * * *